(12) United States Patent
Viswanathan et al.

(10) Patent No.: US 10,806,021 B2
(45) Date of Patent: Oct. 13, 2020

(54) PACKAGED MICROELECTRONIC COMPONENT MOUNTING USING SINTER ATTACHMENT

(71) Applicant: NXP USA, Inc., Austin, TX (US)

(72) Inventors: Lakshminarayan Viswanathan, Phoenix, AZ (US); Lu Li, Gilbert, AZ (US); Mahesh K. Shah, Scottsdale, AZ (US); Paul Richard Hart, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/513,397

(22) Filed: Jul. 16, 2019

(65) Prior Publication Data

US 2019/0342988 A1 Nov. 7, 2019

Related U.S. Application Data

(62) Division of application No. 15/583,566, filed on May 1, 2017, now Pat. No. 10,405,417.

(51) Int. Cl.
| | |
|---|---|
| *H05K 1/02* | (2006.01) |
| *H05K 3/32* | (2006.01) |
| *H05K 3/30* | (2006.01) |
| *H01L 23/00* | (2006.01) |
| *H05K 1/18* | (2006.01) |

(Continued)

(52) U.S. Cl.
CPC .......... *H05K 1/0206* (2013.01); *H01L 21/78* (2013.01); *H01L 23/36* (2013.01); *H01L 23/3735* (2013.01); *H01L 23/3736* (2013.01); *H01L 24/97* (2013.01); *H01L 25/072* (2013.01); *H05K 1/181* (2013.01); *H05K 3/303* (2013.01); *H05K 3/32* (2013.01); *H01L 23/3677* (2013.01); *H01L 23/4334* (2013.01); *H01L 2224/48091* (2013.01); *H01L 2224/48137* (2013.01); *H01L 2224/48175* (2013.01); *H01L 2924/13091* (2013.01); *H05K 2201/0215* (2013.01);

(Continued)

(58) Field of Classification Search
None
See application file for complete search history.

(56) References Cited

U.S. PATENT DOCUMENTS

| | | | | |
|---|---|---|---|---|
| 2003/0227750 | A1* | 12/2003 | Glovatsky | ............ H05K 7/2049 361/699 |
| 2016/0099199 | A1* | 4/2016 | Viswanathan | .......... H01L 23/66 257/666 |

\* cited by examiner

*Primary Examiner* — Alexander G Ghyka
(74) *Attorney, Agent, or Firm* — Charlene R. Jacobsen (57) ABSTRACT

A packaged microelectronic component includes a substrate and a semiconductor die coupled to a top surface of the substrate. A method of attaching the packaged microelectronic component to a secondary structure entails applying a metal particle-containing material to at least one of a bottom surface of the substrate and a mounting surface of the secondary structure. The packaged microelectronic component and the secondary structure are arranged in a stacked relationship with the metal particle-containing material disposed between the bottom surface and the mounting surface. A low temperature sintering process is performed at a maximum process temperature less than a melt point of the metal particles to transform the metal particle-containing material into a sintered bond layer joining the packaged microelectronic component and the secondary structure. In an embodiment, the substrate may be a heat sink for the packaged microelectronic component and the secondary structure may be a printed circuit board.

7 Claims, 4 Drawing Sheets

(51) Int. Cl.
*H01L 25/07* (2006.01)
*H01L 23/373* (2006.01)
*H01L 23/36* (2006.01)
*H01L 23/367* (2006.01)
*H01L 23/433* (2006.01)
*H01L 21/78* (2006.01)

(52) U.S. Cl.
CPC .................. *H05K 2201/066* (2013.01); *H05K 2203/1131* (2013.01); *Y10T 29/4913* (2015.01)

PACKAGED MICROELECTRONIC COMPONENT MOUNTING USING SINTER ATTACHMENT

RELATED APPLICATION

This application is a Divisional of co-pending, U.S. patent application Ser. No. 15/583,566, filed on May 1, 2017.

TECHNICAL FIELD OF THE INVENTION

The present invention relates generally to packaged microelectronic components. More specifically, the present invention relates to methods for producing a packaged microelectronic component and attachment of the packaged microelectronic component to a secondary structure utilizing sinter attachment.

BACKGROUND OF THE INVENTION

Packaged microelectronic components, such as packaged radio frequency (RF) transistor devices, are mounted to secondary structures, such as printed circuit boards with thermal via farms or copper coins in a second level assembly process using solder. Typically, the maximum temperature rating of the resulting solder joint is approximately 110 degrees Celsius (° C.) for long term use. At temperatures above the maximum temperature rating, the solder joint tends to fail by solder creep and fatigue. Accordingly, this maximum temperature rating of the solder joint limits the effective power dissipation and the output power of packaged microelectronic components in high power applications.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, embodiments described herein can provide a packaged microelectronic component capable of being joined to a secondary structure, such as a customer-provided printed circuit board (PCB), utilizing a low temperature sintering process. More particularly, a metal particle-containing material may be applied to an exterior surface of the packaged microelectronic component and/or to a mounting surface of the secondary structure. The packaged microelectronic component and the secondary structure can be joined by sintering the metal particle-containing material to produce a sintered bond layer between the packaged microelectronic component and the secondary structure. The metal particle-containing material can have a much higher melting temperature than solder so that the operational temperature of the packaged microelectronic component coupled to a secondary structure in a system configuration can be raised. This enables higher allowable dissipated power and correspondingly higher output power of the packaged microelectronic component. Accordingly, the sintering process may be utilized to attach high output power packaged components, e.g., laterally diffused metal oxide semiconductor (LDMOS) transistor devices, gallium nitride (GaN) transistor devices, massive multiple-input multiple-output (MIMO) modules, and the like, to a system mounting surface.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
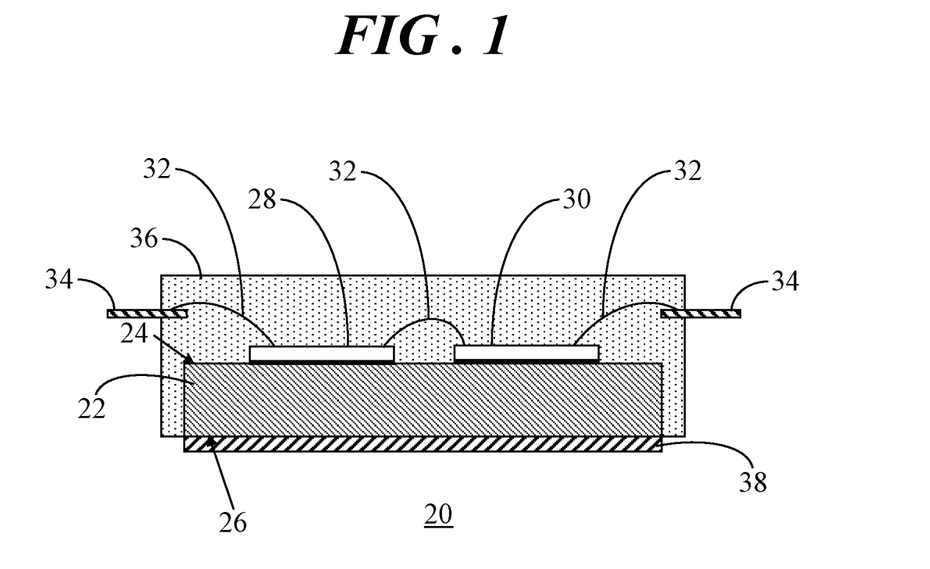
FIG. 1 shows a cross-sectional side view of a packaged microelectronic component in accordance with an embodiment.

Referring to FIG. 1, FIG. 1 shows a cross-sectional side view of a packaged microelectronic component 20 in accordance with an embodiment. Packaged microelectronic component 20 includes a substrate 22 having a top surface 24 and a bottom surface 26. Semiconductor dies 28, 30 are coupled to top surface 24 of substrate 22. Electrical interconnects 32, e.g., bond wires, may electrically interconnect semiconductor dies 28, 30 to one another and/or electrically interconnect semiconductor dies 28, 30 to input/output leads 34 of packaged microelectronic component 20 in accordance with a particular design configuration. In the illustrated example, substrate 22, semiconductor dies 28, 30, electrical interconnects 32, and a portion of input/output leads 34 may be embedded within an encapsulant material 36, such as mold compound, with bottom surface 26 of substrate 22 being exposed from encapsulant material 36. However, other configurations may include a dielectric cover piece in lieu of encapsulant material 36 that is bonded over substrate 22 such that the encapsulant material does not cover the semiconductor die(s) and interconnects, and the terminals are separated by a dielectric material, thus yielding an air cavity package.

One or both of semiconductor dies 28, 30 may be an LDMOS transistor device, GaN transistor device, MIMO module, and/or any other suitable device. Packaged microelectronic component 20 is shown with two semiconductor dies 28, 30 and only a few electrical interconnects 32 and input/output leads 34 for simplicity of illustration. It should be understood, however, that packaged microelectronic component 20 may include only a single semiconductor die, may include more than two semiconductor dies, and may include passive components in addition to the one or more semiconductor dies in accordance with a particular design configuration to yield a complete packaged system. Further, input/output leads 34 are shown in a different plane than substrate 22 in FIG. 1. In other configurations, input/output leads 34 could be coplanar with substrate 22.

In the example configuration, substrate 22 may be a monolithic heat sink wholly composed of copper (Cu), a Cu-based alloy, aluminum, or a similar material. Alternatively, substrate 22 may be a multilayer heat sink of, for example, Cu layers separated by intervening layers of another metallic material to reduce mechanical stresses that may occur within packaged microelectronic component 20. In either instance, the particular structure of substrate 22 is chosen to impart substrate 22 with relatively high thermal conductivity for effectively dissipating heat from semiconductor dies 28, 30. As such, substrate 22 may alternatively be referred to herein as heat sink 22.

In accordance with an embodiment, packaged microelectronic component 20 further includes a metal particle-containing material 38 applied to bottom surface 26 of substrate 22. Metal particle-containing material 38 is configured to sinter to produce a sintered bond layer joining packaged microelectronic component 20 to a secondary structure. Thus, metal particle-containing material 38 is a precursor that will be transformed into a sintered bond layer in accordance with methodology described below.

Figure 2:
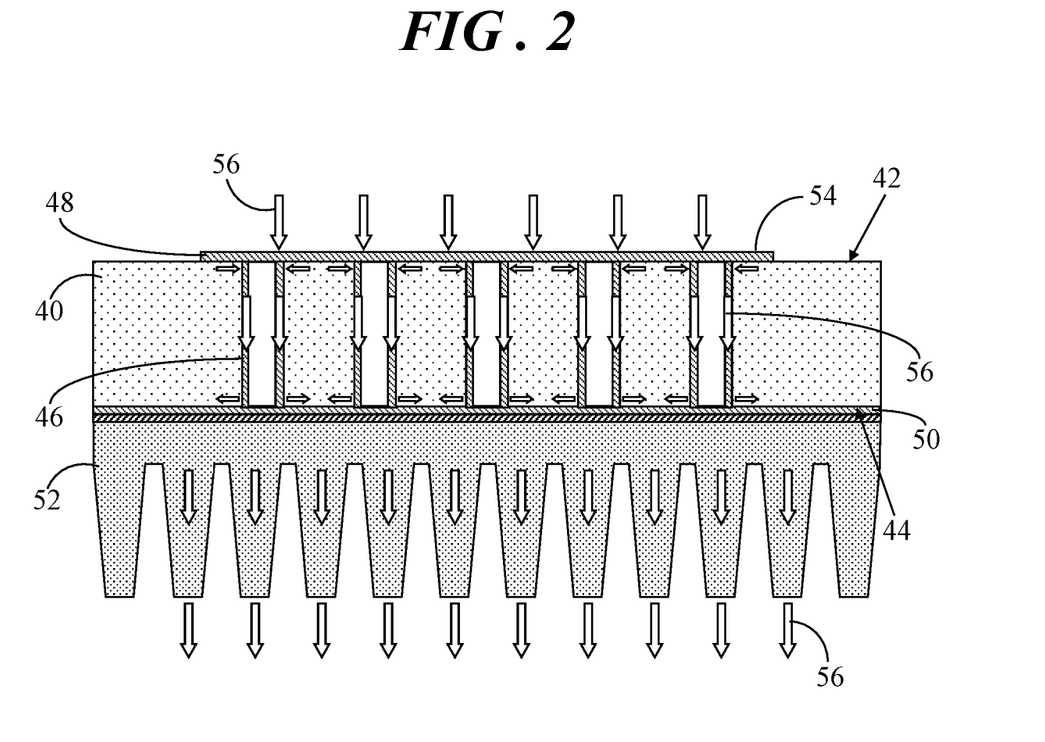
FIG. 2 shows a cross-sectional side view of a secondary structure to which the packaged microelectronic component of FIG. 1 may be mounted.

Referring now to FIG. 2, FIG. 2 shows a cross-sectional side view of a secondary structure 40 to which packaged microelectronic component 20 (FIG. 1) may be mounted. Secondary structure 40 may be a customer-provided printed circuit board (PCB) having a top surface 42, a bottom surface 44, and thermal vias 46 extending through secondary structure 40 between top and bottom surfaces 42, 44. As such, secondary structure 40 may alternatively be referred to herein as PCB 40. An upper metal plate 48, e.g., copper, may be formed on top surface 42 and a lower metal plate 50, e.g., copper, may be formed on bottom surface 44 of PCB 40. Thus, upper and lower metal plates 48, 50 are electrically connected by a matrix of thermal vias 46. In the illustrated configuration, lower metal plate 50 may be adhered or otherwise fastened to a housing 52, which may additionally serve as a system heat sink.

Typically, thermal vias 46 are hollow cylinders of a heat conductive metal, such as copper, created by plating a thin layer of the copper on the inside surface of a hole drilled through PCB 40. However, in other configurations, thermal vias 46 may be solid columns of heat conductive metal. In general, a packaged device, such as packaged microelectronic component 20, may be attached to upper metal plate 48. As such, upper metal plate 48 may serve as a mounting surface 54 of the secondary structure, i.e., PCB 40. During operation, a packaged microelectronic component joined to mounting surface 54 of PCB 40 generates heat, as represented by arrows 56, on its outer surface. Heat 56 is intercepted by upper metal plate 48. Because of the high thermal conductivity of the copper lined thermal vias 46, a majority of heat 56 will converge to the locations of thermal vias 46, flow along the length of thermal vias 46, and then diverge upon reaching lower metal plate 50. This heat may then be extracted from lower metal plate 50 by housing 52. For example, heat 56 may radiate off of thermally conductive fins of housing 52. Arrows 56 depicting heat appear across the entire upper metal plate 48 for illustrative purposes. Those skilled in the art will recognize that a number of packaged microelectronic components will generate heat 56 in a very small area rather than the entire upper metal plate 48. Further, although the majority of heat 56 is dissipated through thermal vias 46, PCB 40 will also dissipate some of the heat 56.

Packaged microelectronic components, such as LDMOS transistor devices, GaN transistor devices, MIMO modules, and other such radio frequency (RF) transistor devices are mounted to printed circuit boards with thermal via farms such as that shown in FIG. 2 and/or embedded copper coins in a second level assembly process using solder. Solder is typically used as an attach material due to its low melting point and re-workability. Unfortunately, a drawback of the use of solder is that due to its low melting point temperature, it also tends to go through creep induced failures in the high temperature use environments of modern electronics. Thus, industry restricts the solder joint maximum temperature rating to a range of 100 degrees Celsius (° C.) to 110° C.

Accordingly, in a surface mount configuration, it may be the solder joint temperature that restricts the use temperature of the system (the use temperature being the temperature range to which the system will be exposed in an end product). Current high power RF components typically have low enough thermal resistance so that the solder joint is increasingly becoming the critical criteria limiting the use temperature of the system.

The following describes methodology for producing a packaged microelectronic component and joining the packaged microelectronic component to a secondary structure using metal particle-containing material 38 and performing a low temperature sintering process. The inclusion of metal particle-containing material 38 configured to sinter, and that is at least as conductive as solder and having a higher melting point temperature than solder, enables the use temperature of a system that includes packaged microelectronic component 20 to be raised, and consequently, the allowable power dissipation limit is raised.

Figure 3:
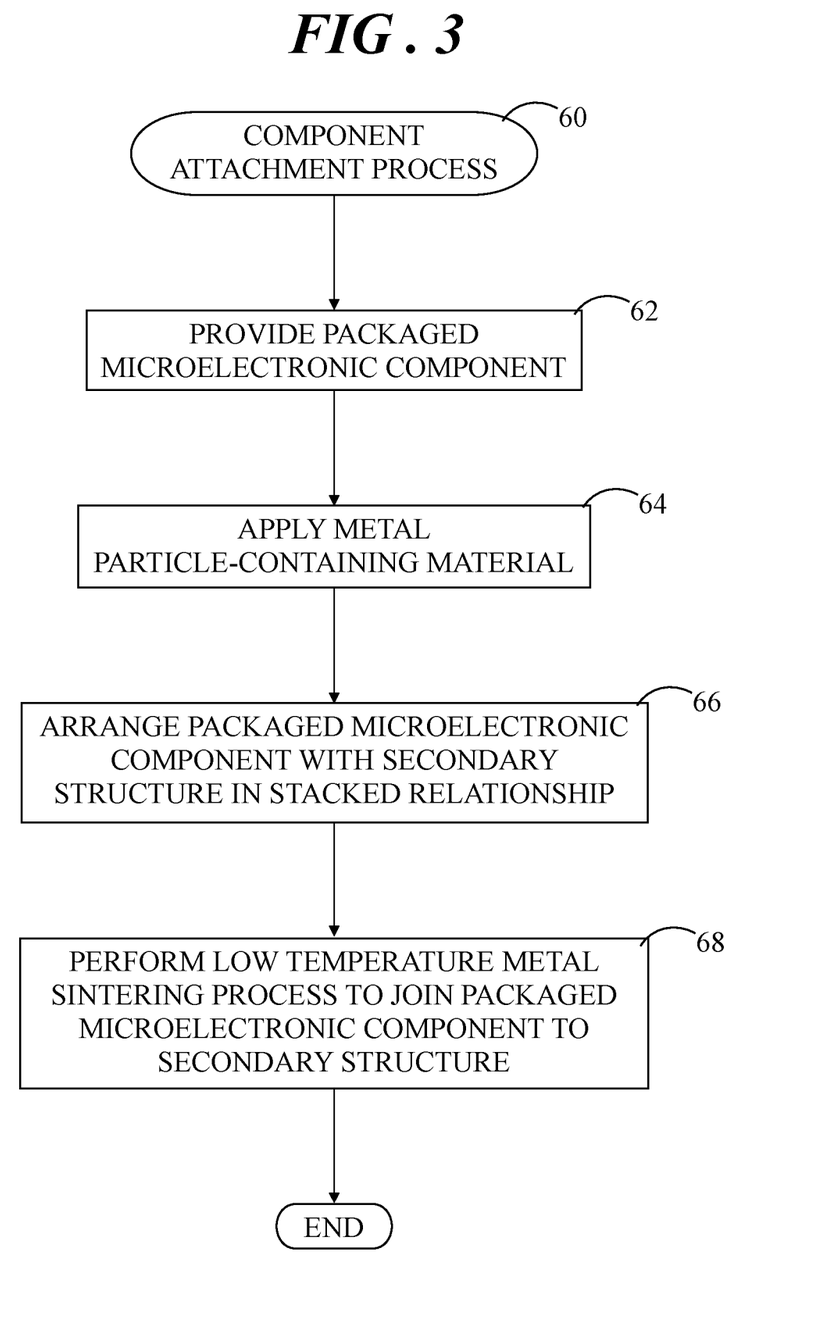
FIG. 3 shows a flowchart of a packaged microelectronic component attachment process in accordance with another embodiment.

FIG. 3 shows a flowchart of a packaged microelectronic component attachment process 60 in accordance with another embodiment. Attachment process 60 includes a number of process blocks, each of which will be described in detail below. Each process block generically illustrated in FIG. 3 may entail a single process or multiple sub-processes. Furthermore, the process blocks illustrated in FIG. 3 and described below are provided by way of non-limiting example. In alternative embodiments of attachment process 60, additional process blocks may be performed, certain process blocks may be omitted, and/or the illustrated process blocks may be performed in alternative sequences.

At a process block 62, packaged microelectronic component 20 is provided. As described in detail in connection with FIG. 1, packaged microelectronic component 20 includes substrate 22 (e.g., heat sink 22) having top and bottom surfaces 24, 26 and semiconductor dies 28, 30 coupled to top surface 24 of heat sink 22. In some embodiments, packaged microelectronic component 20 is an individual unit. In other embodiments, heat sink 22 may be a heat sink panel having a plurality of semiconductor dies coupled to it to yield a plurality of packaged microelectronic components that are temporarily formed in a single panel unit of packaged microelectronic components.

At a process block 64, metal particle-containing material 38 is applied to at least one of bottom surface 26 of heat sink 22 and mounting surface 54 (FIG. 2) of PCB 40 (FIG. 2) utilizing a dry state application technique, a wet state application technique, or in any manner permitting controlled application of metal particle-containing material 38. Metal particle-containing material 38 may be applied to heat sink 22 in the form of a freestanding film or tape to bottom surface 26 of heat sink 22. For example, metal particle-containing material 38 may be applied to bottom surface 26 of heat sink 22 utilizing a film transfer process. In other embodiments, metal particle-containing material 38 may be applied by dispensing metal particle-containing material 38 onto bottom surface 26 of heat sink 22 in a flowable wet state utilizing a wet-state application process. In still other embodiments, metal particle-containing material 38 may be applied to mounting surface 54 (FIG. 2) of PCB 40 in the form of film, tape, or in a flowable wet state.

When a heat sink panel having a plurality of semiconductor dies coupled to its top surface 24 is provided at process block 64, metal particle-containing material 38 may be applied over its entire bottom surface 26 using any of the aforementioned techniques. Following application of metal particle-containing material 38, the heat sink panel can be singulated to produce a plurality of packaged microelectronic components (each of which includes metal particle-containing material 38 applied to its bottom surface) that may be utilized in subsequent process operations of attachment process 60. Singulation can be carried-out by sawing (e.g., utilizing a water-cooled dicing saw), laser cutting, water jetting, stamping, or scribing with punching, to list but a few examples. This singulation process could be performed following or prior to coupling of the semiconductor dies to its top surface 24.

In a dry state film transfer process application technique, a dry film may first be prepared by, for example, initially depositing (e.g., screen printing or otherwise dispensing) metal particle-containing material 38 onto a temporary substrate or carrier, such as a plastic (e.g., polyethylene terephthalate (PET) or other material) tape backing. The metal particle-containing material 38 may be applied in a wet, flowable state to the carrier and then heated or otherwise dried to yield the dry film. Next, the dry film is transferred to the appropriate surface (e.g. bottom surface 26 and/or mounting surface 54). In this regard, a given metal particle-containing material 38 is positioned in contact with a chosen metal layer or sheet. Heat, pressure, or both heat and pressure are then applied to adhere the metal particle-containing material 38 (dry film) to the selected metal layer or sheet surface. The carrier (e.g., tape backing) may then be removed by physical removal (e.g., peeling away) or by dissolution in a chemical solvent. Alternatively, one or more freestanding films may simply be positioned between bottom surface 26 and mounting surface 54 during a stacking process (also considered "film transfer" in the present context).

Suitable wet state application techniques include, but are not limited to, screen or stencil printing, doctor blading, spraying, painting, and dipping. When a wet state application technique is employed, a flowable or wet state coating precursor material is initially obtained by, for example, independent production or purchase from a third party supplier. In addition to metal particles (described below), the wet state coating precursor material contains other ingredients (e.g., a solvent and/or surfactant) to facilitate wet set application, to adjust the viscosity of the precursor material, to prevent premature agglomeration of the metal particles, and/or to serve other purposes. In one embodiment, the wet state coating precursor material contains metal particles in combination with a binder (e.g., an epoxy), a dispersant, and a thinner or liquid carrier. The volume of solvent or liquid carrier contained within the coating precursor material can be adjusted to tailor of the viscosity of the precursor material to the selected wet state application technique. For example, in embodiments wherein metal particle-containing material 38 is applied by screen printing or doctor blading, the coating precursor material may contain sufficient liquid to create a paste, slurry, or paint. After application of the wet state coating material, a drying process can be carried-out to remove excess liquid from metal particle-containing material 38, if so desired.

The particular formulation or composition of metal particle-containing material 38 may vary amongst embodiments, providing that the particular formulation or composition of metal particle-containing material 38 contains metal particles that are configured to sinter (become a compacted solid mass without melting) during a sintering process. In an embodiment, metal particle-containing material 38 contains at least one of silver particles, gold particles, copper particles, and platinum particles, or a mixture thereof. In another embodiment, the metal particles contained within metal particle-containing material 38 consist essentially of silver or copper particles. And in still other embodiments, the metal particles contained within metal particle-containing material 38 can be any suitable thermally and/or electrically conductive particle capable of being joined by sintering. The metal particles contained within metal particle-containing material 38 may or may not be coated with an organic material. For example, in some implementations, the metal particles may be coated with an organic dispersant, which prevents physical contact between the particles to prevent premature agglomeration or particle sintering. When present, any such organic particle coating may be burned away or decomposed during the below-described metal sintering process.

The metal particles contained within metal particle-containing material 38 can have any shape or combination of shapes including, but not limited to, spherical shapes, oblong shapes, and platelet or laminae shapes. The average dimensions of the metal particles will vary in conjunction with particle shape and process parameters. However, in general, the average maximum dimension of the metal particles (e.g., the diameter of the metal particles when spherical or the major axis of the metal particles when oblong) may be between about 100 microns ($\mu$m) and about 10 nanometers (nm) in an embodiment. In other embodiments, the metal particles may have average maximum dimension greater than or less than the aforementioned range. In certain implementations, a mixture of metal particles having average maximum dimensions in both the nanometer and micron range may be utilized. In other implementations, only nanoparticles (that is, particles having average maximum dimension between 1 and 1000 nm) may be contained within metal particle-containing material 38. As a specific, albeit non-limiting example, metal particle-containing material 38 may contain at least one of silver, gold, copper and platinum nanoparticles in an embodiment, with silver or copper nanoparticles being preferred.

Metal particle-containing material 38 may or may not contain organic materials. For example, metal particle-containing material 38 may be essentially free of organic material (that is, contain less than 1 wt % of organic materials). In other embodiments, metal particle-containing material 38 may contain resin or other organic fillers. For example, metal particle-containing material 38 may contain organic materials that increase pliability, such as an epoxy resin, to reduce the likelihood of crack formation and propagation across thermal cycles of a system that includes packaged microelectronic component 20 mounted to PCB 40. Depending upon the desired final composition of the sintered metal particle-containing material 38, the parameters of the sintering process may be controlled to decompose the organic materials from the metal particle-containing material 38, in whole or in part. For example, upon undergoing a sintering process under process conditions, a substantial portion of the epoxy within metal particle-containing material 38 remains within the sintered bond layer between heat sink 22 and PCB 40.

A process block 66 is performed after application of metal particle-containing material 38 at process block 64. At process block 66, packaged microelectronic component 20 is arranged in a stacked relationship with PCB 40 such that metal particle-containing material 38 is disposed between packaged microelectronic component 20 and PCB 40.

At a process block 68, a low temperature sintering process is performed at a maximum process temperature ($T_{MAX}$) that is less than the melting point of the metal particles within metal particle-containing material 38 to transform metal particle-containing material 38 into a sintered bond layer joining packaged microelectronic component 20 and PCB 40. The low temperature sintering process can be carried-out under any process conditions suitable for transforming metal particle-containing material 38 into a sintered bond layer. The sintering process may be performed with or without pressure, with or without heating (although some degree of elevated heat will typically be applied), and in any suitable atmosphere (preferably open air).

As a point of emphasis, however, the sintering process is carried-out at maximum process temperatures ($T_{MAX}$) less than the melt point of the metal particles contained within metal particle-containing material 38. Indeed, in many embodiments, $T_{MAX}$ will be significantly less than the melt point of the metal particles and, perhaps, less than one half the melt point of the particles considered on an absolute temperature scale (in Kelvin). Generally, $T_{MAX}$ will be greater than room temperature (considered 20° C. herein) and less than 300° C. Comparatively, the melt point of silver, gold, copper, and, platinum particles in a nanometer or micron size range will commonly range between 950° C. to 1800° C. To provide a still further example, $T_{MAX}$ may be between 130° C. and 300° C. in an embodiment. In still further embodiments, $T_{MAX}$ may be greater than or less than the aforementioned range, providing that $T_{MAX}$ (in conjunction with the other process parameters) is sufficient to induce sintering of the metal particles without liquefaction of the metal particles or adversely affecting the integrity of the structure in which it is attached. For example, the heat deflection temperature of a printed circuit board material (thereby defining $T_{MAX}$) is typically limited to the 130° C. range for common PCB materials, such as FR-4 (flame resistant grade designation four) glass epoxy. Although some other materials such as polyimide-based PCB laminates may allow higher temperatures ranges.

In some implementations, a multistage heating schedule may be employed during the sintering process. In this case, the multistage heating schedule may entail heating the stacked arrangement of packaged microelectronic component 20 and PCB 40 to a first temperature ($T_1$) less than $T_{MAX}$ for a first time period, gradually ramping the temperature to $T_{MAX}$, maintaining $T_{MAX}$ for a second time period, and concluding with a cool down period. In one embodiment, and by way of non-limiting example only, $T_1$ may be between 100 and 200° C., while $T_{MAX}$ is greater than $T_{MAX}$ and may range between 130 and 300° C. The first time period of heat at the lower temperature may be performed to remove solvents from metal particle-containing material 38 that do not form the final structure. The second time period of heat at the higher temperature is performed to sinter the mounting surfaces and, if present, cure the epoxy resin. As discussed below, the process parameters employed may or may not be selected to fully decompose any organic material from metal particle-containing material 38 during sintering.

The low temperature sintering process may be performed with no or minimal pressure. Alternatively, a convergent pressure or compressive force may be applied to the stacked arrangement of packaged microelectronic component 20 and PCB 40 during the sintering process. When applied, the convergent pressure can be delivered as a substantially constant force or, instead, varied in accordance with a time-based or temperature-based schedule. Any suitable mechanism can be utilized to apply the desired convergent pressure including bulk weights, resilient bias devices (e.g., spring-loaded plungers or pins), clamps, hydraulic presses, and the like. The pressure applied may be selected based upon various factors including the desired final thickness of the sintered bond layer, the desired porosity of the sintered bond layer, and the composition of metal particle-containing material 38. In one embodiment, and by way of non-limiting example only, a maximum pressure ($P_{MAX}$) ranging between about 0.5 and about 10 megapascal (MPa) is applied during the sintering process. In other embodiments, $P_{MAX}$ may be greater than or less than the aforementioned range, if pressure is applied during the sintering process.

Following sintering at process block 68, attachment process 60 ends. However, in alternative embodiments, further processing steps may be performed following sintering that are not described herein for brevity.

Figure 4:
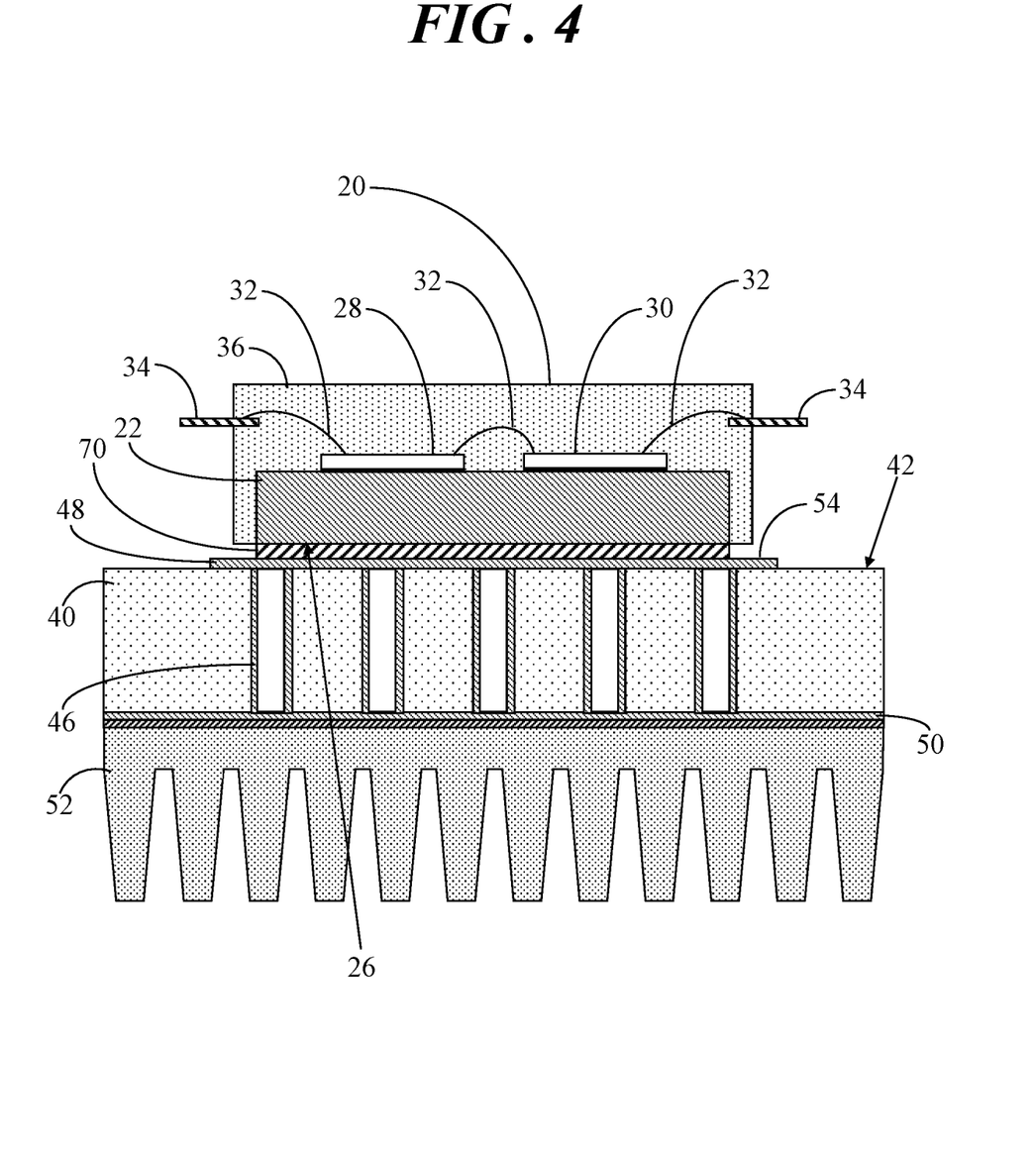
FIG. 4 shows the packaged microelectronic component of FIG. 1 following its attachment to the secondary structure of FIG. 2 in accordance with the process of FIG. 3.

FIG. 4 shows the packaged microelectronic component 20 following its attachment to the secondary structure (i.e., PCB 40) in accordance with attachment process 60 (FIG. 3). In this example, attachment process 60 transforms metal particle-containing material 38 (FIG. 1) to a sintered bond layer 70. That is, sintered bond layer 70, produced during sintering, joins packaged microelectronic component 20 to PCB 40 during a second level assembly process. In a non-limiting example, a silver sintered bond layer 70 can be used for extended periods at greater than 150° C. without degradation. Thus, the limitation of the interface temperature is raised from 110° C. using a solder bond layer to a temperature that corresponds to the use temperature limit for PCB 40 or the mount system. Accordingly, the constraints formerly defined by the attach material are eliminated.

Figure 5:
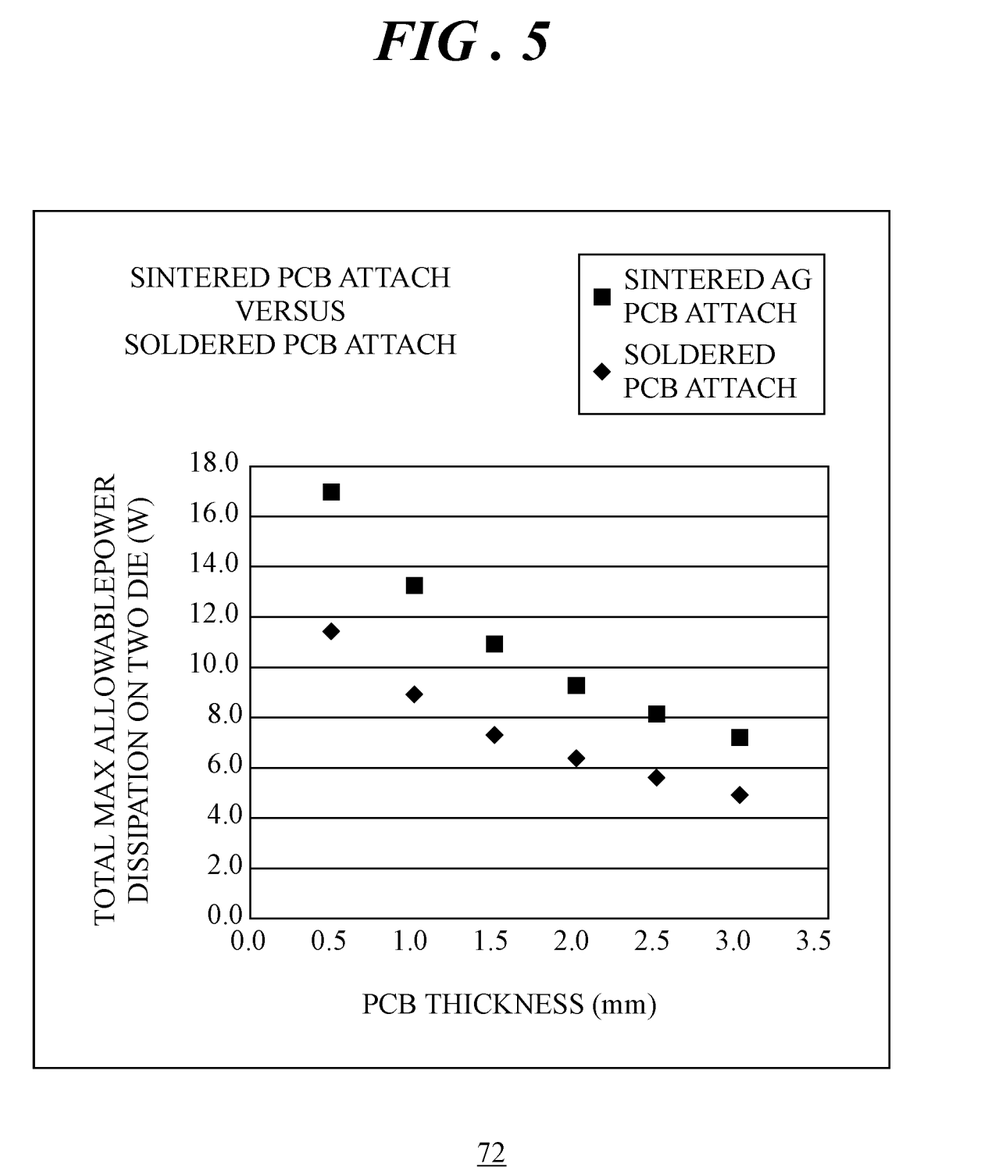
FIG. 5 shows a graph demonstrating an example of the maximum allowable power dissipation for sintered PCB attachment versus solder PCB attachment.

FIG. 5 shows a graph 72 demonstrating an example of the maximum allowable power dissipation for sintered PCB attachment versus soldered PCB attachment. In this example, metal particle-containing material 38 (FIG. 1) having silver particles was used to form sintered bond layer 70 (FIG. 4). The maximum allowable power dissipation for sintered versus soldered PCB attach is compared across a variety of thicknesses of a PCB. It can be readily observed from graph 72 that the maximum allowable power dissipation for sintered silver PCB attach (represented by square symbols) is on average approximately 46% higher than that for soldered PCB attach (represented by diamond symbols). Accordingly, a sintered attach technique could be applied to attach LDMOS or GaN transistor devices, massive MIMO modules, and the like to a system mounting surface. This enables higher power dissipation, and therefore higher output power of such packaged microelectronic components.

The above sintering methodology is described in connection with a packaged microelectronic component having a heat sink substrate and input/output leads 34 (FIG. 1). It should be understood, however, that the above sintering methodology applies equivalently to other structural configurations. For example, a packaged microelectronic component may not have input/output leads, but may instead have input/output terminals separated from one another by dielectric material at bottom surface 26 of substrate 22, thus forming a leadless package. Such input/output terminals formed at bottom surface 26 can be attached to contacts on PCB 40 through execution of component attachment process 60 (FIG. 3) to form a sintered metal bond layer. In another embodiment, input/output terminals formed at bottom surface 26 that require excellent thermal and electrical grounding may be attached to contacts on PCB 40 through execution of component attachment process 60 to form a sintered metal bond layer, and other output terminals that are not subject to such thermal and electrical grounding constraints may be connected using solder.

Additionally, the secondary structure discussed above in connection with the sintering methodology could vary from that which is described. For example, the secondary structure may be a printed circuit board with embedded copper. As another example, the secondary structure for a leaded package could be a metal coin that is inserted through a cavity formed within the PCB and attached directly to a system heat sink. Other structural variations of the secondary structure may also be envisioned.

Embodiments of a packaged microelectronic component and attachment methodology have been provided. In an embodiment, a method of producing a packaged microelectronic component comprises providing the packaged microelectronic component that includes a substrate having a top surface and a bottom surface, a semiconductor die coupled to the top surface, and applying a metal particle-containing material to the bottom surface of the substrate, the metal particle-containing material being configured to sinter to produce a sintered bond layer joining the packaged microelectronic component to a secondary structure.

In another embodiment, a method of attaching a packaged microelectronic component to a secondary structure comprises providing the packaged microelectronic component that includes a substrate having a top surface and a bottom surface, a semiconductor die coupled to the top surface, applying a metal particle-containing material to at least one of the bottom surface of the substrate and a mounting surface of the secondary structure, arranging the packaged microelectronic component and the secondary structure in a stacked relationship with the metal particle-containing material disposed between the bottom surface and the mounting surface of the secondary structure, and sintering the metal particle-containing material at a maximum process temperature less than a melting point of metal particles in the metal particle-containing material to produce a sintered bond layer joining the packaged microelectronic component to the secondary structure.

In still another embodiment, packaged microelectronic component comprises a substrate having a top surface and a bottom surface, a semiconductor die coupled to said top surface, and a metal particle-containing material applied to said bottom surface of said substrate, said metal particle-containing material being configured to sinter to produce a sintered bond layer joining said packaged microelectronic component to a secondary structure.

Thus, a packaged microelectronic component capable of being joined to a secondary structure utilizes a metal particle-containing precursor material and a low temperature sintering process to form a sintered bond layer between the packaged microelectronic component and a secondary structure. The metal particle-containing material has a relatively high melting point so that the operational temperature of the packaged microelectronic component coupled to a secondary structure in a system configuration can be raised. This enables higher allowable dissipated power and correspondingly higher output power of the packaged microelectronic component. Accordingly, the sintering process may be utilized to attach high output power packaged components, e.g., laterally diffused metal oxide semiconductor (LDMOS) transistor devices, gallium nitride (GaN) transistor devices, massive multiple-input multiple output (MIMO) modules, and the like, to a system mounting surface.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A packaged microelectronic component comprising:
a substrate having a top surface and a bottom surface;
a semiconductor die coupled to said top surface; and
a metal particle-containing material applied to said bottom surface of said substrate, said metal particle-containing material being configured to sinter to produce a sintered bond layer joining said packaged microelectronic component to a secondary structure, wherein:
said secondary structure comprises a printed circuit board having thermal vias extending through it;
said substrate comprises a heat sink configured for attachment to a mounting surface of said printed circuit board; and
said metal particle-containing material is configured to join said heat sink with said thermal vias.

2. The packaged microelectronic component of claim 1 wherein said metal particle-containing material is in the form of a film or tape having metal particles containing at least one of silver particles, gold particles, copper particles, and platinum particles.

3. The packaged microelectronic component of claim 1 wherein said metal particle-containing material is configured to be interposed between the heat sink and the thermal vias.

4. The packaged microelectronic component of claim 1 wherein said mounting surface of said printed circuit board comprises an upper metal plate electrically connected to the thermal vias, and said metal particle-containing material is configured to be interposed between the heat sink and the upper metal plate.

5. A device comprising:
   a packaged microelectronic component comprising:
   a heat sink having a top surface and a bottom surface;
   a semiconductor die coupled to said top surface of said heat sink; and
   a metal particle-containing material applied to said bottom surface of said heat sink; and
   a printed circuit board having thermal vias extending through it, wherein said metal particle-containing material is sintered to produce a sintered bond layer joining said heat sink to a mounting surface of said printed circuit board, wherein the metal particle-containing material joins said heat sink with said thermal vias.

6. The device of claim 5 wherein the sintered bond layer is interposed between the heat sink and the thermal vias.

7. The device of claim 5 wherein said mounting surface of said printed circuit board comprises an upper metal plate electrically connected to the thermal vias, and said sintered bond layer is interposed between said heat sink and said upper metal plate.

* * * * *